(12) United States Patent
Liu

(10) Patent No.: US 7,334,691 B2
(45) Date of Patent: Feb. 26, 2008

(54) GLASS SUBSTRATE CASSETTE

(75) Inventor: Shiang-Chiang Liu, Taipei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/092,767

(22) Filed: Mar. 30, 2005

(65) Prior Publication Data
US 2006/0032826 A1   Feb. 16, 2006

(30) Foreign Application Priority Data
Aug. 13, 2004   (TW) .............................. 93124413 A

(51) Int. Cl.
*A47G 19/08* (2006.01)
(52) U.S. Cl. ................. 211/41.18; 211/41.17; 206/710; 206/711
(58) Field of Classification Search ............. 211/41.18, 211/41.17, 41.1, 41.12, 40; 206/710, 454, 206/832, 711, 722, 723; 414/935
See application file for complete search history.

(56) References Cited

U.S. PATENT DOCUMENTS

| | | | | |
|---|---|---|---|---|
| 2,746,667 A | * | 5/1956 | Murphy | 206/454 |
| 3,923,156 A | * | 12/1975 | Wallestad | 206/454 |
| 4,155,447 A | * | 5/1979 | Edwards | 206/708 |
| 4,721,207 A | * | 1/1988 | Kikuchi | 206/307 |
| 4,930,634 A | * | 6/1990 | Williams et al. | 206/454 |
| 5,577,621 A | * | 11/1996 | Yi | 211/41.18 |
| 5,823,361 A | * | 10/1998 | Babbs | 211/41.17 |
| 5,853,214 A | * | 12/1998 | Babbs et al. | 294/161 |
| 5,890,598 A | * | 4/1999 | Hayashida et al. | 206/710 |
| 6,145,673 A | * | 11/2000 | Burrows et al. | 211/41.18 |
| 6,186,344 B1 | | 2/2001 | Park et al. | 211/41.1 |
| 6,691,876 B2 | * | 2/2004 | Tsai et al. | 211/41.18 |
| 2003/0173316 A1 | * | 9/2003 | Park et al. | 211/41.18 |
| 2004/0069680 A1 | * | 4/2004 | Song | 206/711 |

* cited by examiner

*Primary Examiner*—Kambiz Abdi
*Assistant Examiner*—Lindsay M. Maguire
(74) *Attorney, Agent, or Firm*—Troxell Law Office, PLLC

(57) ABSTRACT

A glass substrate cassette includes a bottom structure, a top structure, and a pair of side supports affixed to space the bottom structure and the top structure for forming an accommodation space in between. A plurality of support plates are horizontally affixed between the side supports. Each of the support plates is shaped as a corrugated plate structure for supporting thereon a glass substrate. The corrugated support plate has recess portions for allowing a delivering device to load and/or unload the glass substrates.

14 Claims, 5 Drawing Sheets

GLASS SUBSTRATE CASSETTE

This application claims the benefit of Taiwan Patent Application Serial No. 93124413, filed on Aug. 13, 2004, the subject matter of which is incorporated herein by reference.

BACKGROUND OF THE INVENTION (1) Field of the Invention

The invention relates to a glass substrate cassette, and more particularly to a cassette for supporting large-size glass substrates.

(2) Description of the Related Art

With prosperous growth in Thin Film Transistor Liquid Crystal Display (TFT LCD) technology, the TFT LCD has gradually displaced the cathode ray tube (CRT) display in the market and become the mainstream of the display technology. The TFT LCD having various advantages such as compactness in size, low power consumption and low radiation is widely applied to electronic products such as personal digital assistants (PDAs), mobile phones, digital video cameras, digital cameras, notebook computers, and televisions.

One of key components in a typical TFT LCD is a glass substrate. The glass substrate has a large amount of thin film transistors formed thereon. These transistors serve as switch devices for controlling pixel brightness of the display, in which the pixel is the basic element in the TFT LCD for forming a desired image on the liquid crystal display. In manufacturing the TFT LCDs, a cassette is usually used to transport and/or buffer the fragile glass substrates.

Referring to FIG. 1A, a conventional cassette 1 for stacking a plurality of glass substrates 4 is illustrated. As shown, the cassette 1 is formed as a hollow container 10 with a fully-open transporting gate 11 in a front side. A plurality of pairing support pins 12 are affixed to opposing lateral sides of the transporting gate 11. A socket 13 is therefore formed between adjacent support pins 12. The glass substrates 4 can be stored into the respective sockets 13 and thus supported by the underneath support pins 12. In this design, a delivery device 5 can be used to load/unload the substrates 4 with respect to the sockets 13.

For the sixth-generation TFT LCDs, a conventional cassette 1 may store broad and thin glass substrates that have a dimension of about 1500 mm×1850 mm. When the glass substrate 4 is supported by the support pins 12 as shown in FIG. 1B, the substrate 4 will deflect downward to form a concave shape due to the gravity. It is apparent that an abrupt contact between the delivery device 5 and the brittle glass substrate 4 during the loading/unloading process may break the glass substrate 4 and cause irreversible damage to the substrate 4.

Referring to FIG. 2A, another conventional cassette 2 having a plurality of support wires 21 connecting two opposing lateral sides of the cassette 2 is shown. The socket 22 may be formed between every two adjacent support wires 21. The glass substrate 4 is stored in the socket 22 and supported by the support wires 21. However, the glass substrate 4 still deflects concavely due to its own weight and the flexibility of the support wire 21.

To overcome the problem of deflection of the substrate 4 in the cassette, transport rollers 6 can be introduced into the cassette 4 for bearing the glass substrates 4, as shown in FIG. 2B. The transport rollers 6 may approach the glass substrate 4 from the bottom of the cassette 2 to lift the glass substrate 4 and unload the glass substrate 4 from the cassette 2, as shown in FIG. 2B.

Generally, the substrates 4 are unloaded from the bottom of the cassette 2 to the top. On the other hand, the loading of the substrates 4 into the cassette 2 needs to follow a top-to-bottom order. It is clear that such design of the cassette 2 are unable to load/unload the substrates 4 in an arbitrary order.

Referring to FIG. 3, it shows a third conventional cassette 3. As compared to the above designs, the cassette 3 has parallel back support rods 33 affixed to the back side 32 of the cassette 3. The back support rod 33 is a cantilever extending toward the transporting gate 34 to support the glass substrate. However, the cantilever back support rod 33 also deflects and thus the problem associated with concave substrates in the cassette 3 still remains.

The disadvantages mentioned above are getting worse, especially when the glass substrate is broad and thin. In particular, with the brittle glass substrate stored in the cassette as described above, even a small impact or a low-energy vibration with a frequency close to the nature resonance frequency of the substrate may easily break the substrate.

SUMMARY OF THE INVENTION

Accordingly, it is an object of the present invention to provide a cassette for carrying a glass substrate without a substantial midway curve-in deflection in the substrate.

It is another object of the present invention to provide a cassette for carrying a glass substrate without inducing a significant surface stress to damage the substrate.

It is still another object of the present invention to provide a cassette for carrying a large scale glass substrate without increasing the safety height of each socket.

It is still another object of the present invention to provide a cassette for carrying a large scale glass substrate that can protect the substrate from possible resonance damage.

According to the present invention, the cassette includes a bottom structure, a top structure, a pair of side supports facing each other and affixed to the bottom structure and the top structure, and a plurality of support plates horizontally affixed to the pair of side supports. Adjacent support plates are separated in a predetermined interval. Each of the support plates is formed as a corrugated structure having recess portions. A delivery device, such as a robot arm, is inserted into the recess portions for loading or unloading a glass substrate supported on the support plate.

Preferably, a transport gate for allowing the substrate to enter and/or leave the cassette is located in the front of the cassette. The delivery device can pass through the transport gate and insert into the recess portions of a selected support plate for loading or unloading a glass substrate upon the support plate. Further, it is preferable that a rear support can be affixed to the bottom structure and the top structure to prevent the glass substrate from slipping out during its transportation.

It is preferable that the support plate can be made of a thin plate material, such as an aluminum plate, a steel plate, a titanium plate, a reinforced fiberglass plate, and a reinforced carbon fiber. The support plate and the inner surface of the pair of the side supports may be connected by screw bolts. According the theory of shells, the corrugated support plate of the present invention can sustain a heavier load than a simple plane plate such that the deflection of the support plate can be substantially reduced. Furthermore, the surface stress on the glass substrate due to the deflection can also be eliminated and so the damage of the components of the glass substrate can be avoided.

It is preferable that the corrugated support plate ensures the supporting capacity of the cassette, because no additional space for digesting the midway deflection factor is required between the adjacent support plates. In addition, the number and the size of the recess portions in the support plate is determined by considering fitting of the delivery device for loading or unloading.

It is preferable for the support plate to have a plurality of through holes for draining during the process of rinse. The weight of the cassette can also be reduced for the existence of the through holes. Also, the arrangement of the through holes can be used to adjust the natural resonance frequency of the cassette.

It is preferable that the bottom structure, the top structure, the side supports, and the rear support can be formed as plates or frames.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 1A:
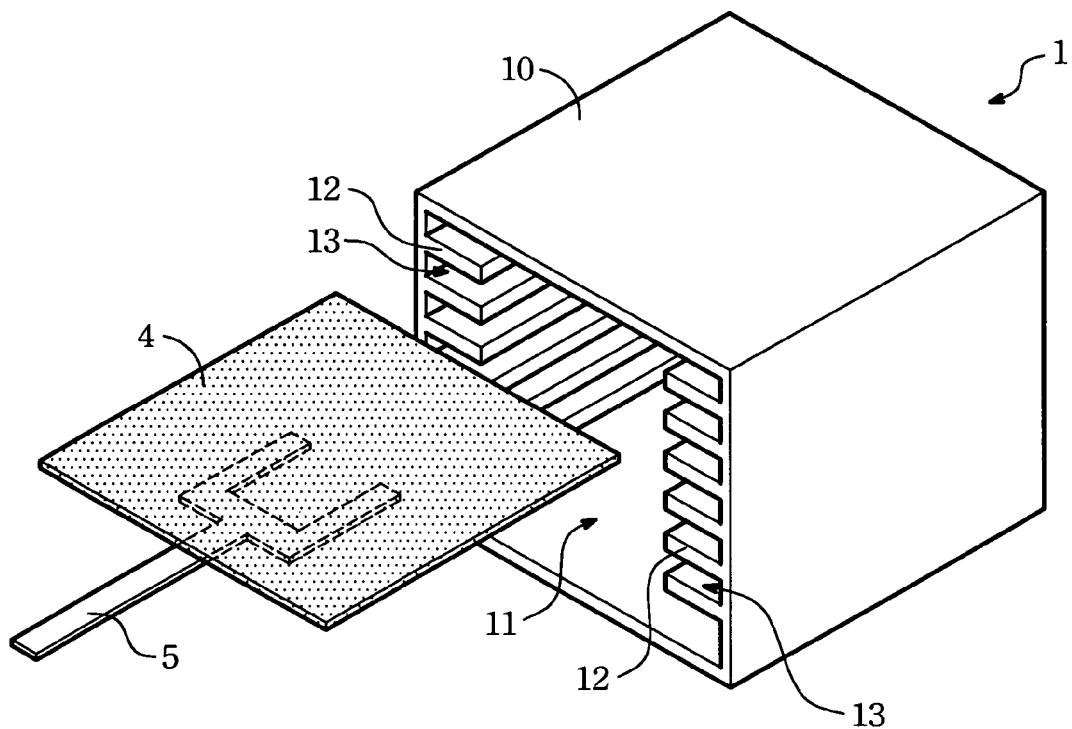
FIG. 1A is a schematic perspective diagram of a first conventional cassette and a separate glass substrate.
Figure 1B:
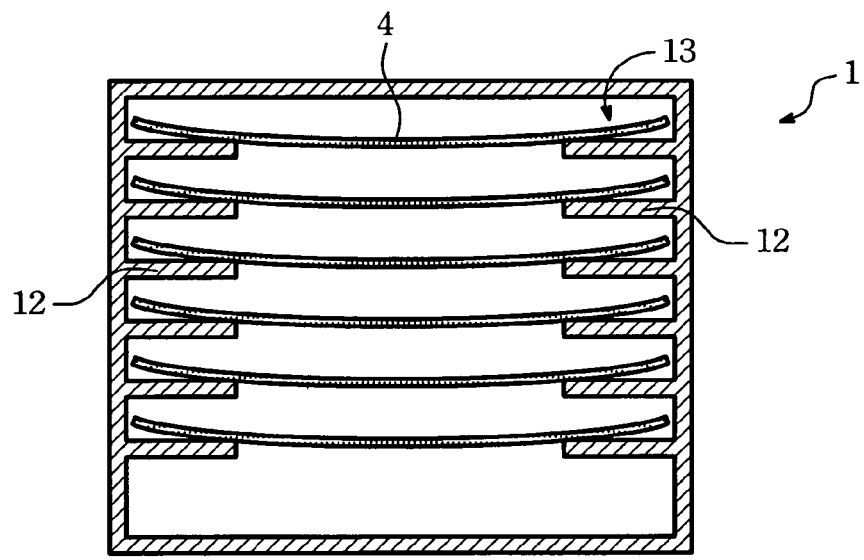
FIG. 1B is a schematic front view of the cassette of FIG. 1A, in which a plurality of the glass substrates has been found in respective sockets of the cassette.
Figure 2A:
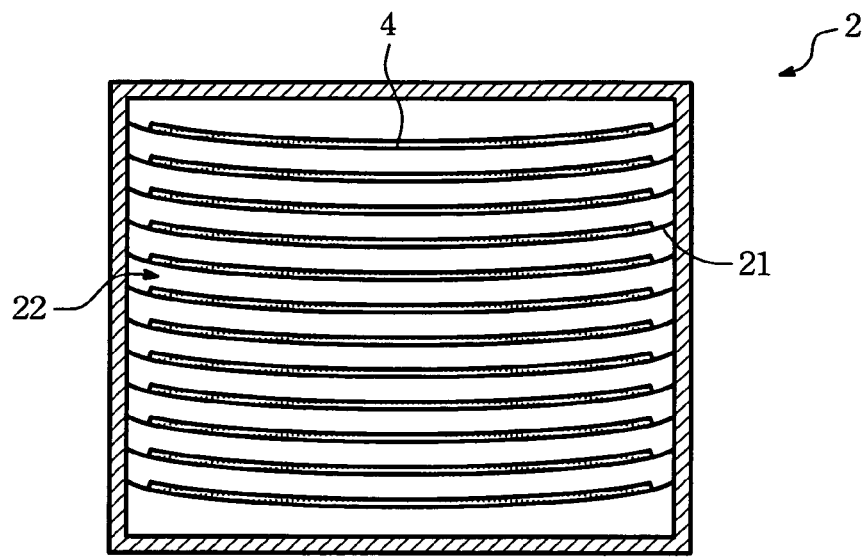
FIG. 2A is a schematic front view of another conventional cassette having the glass substrates stored in respective sockets.
Figure 2B:
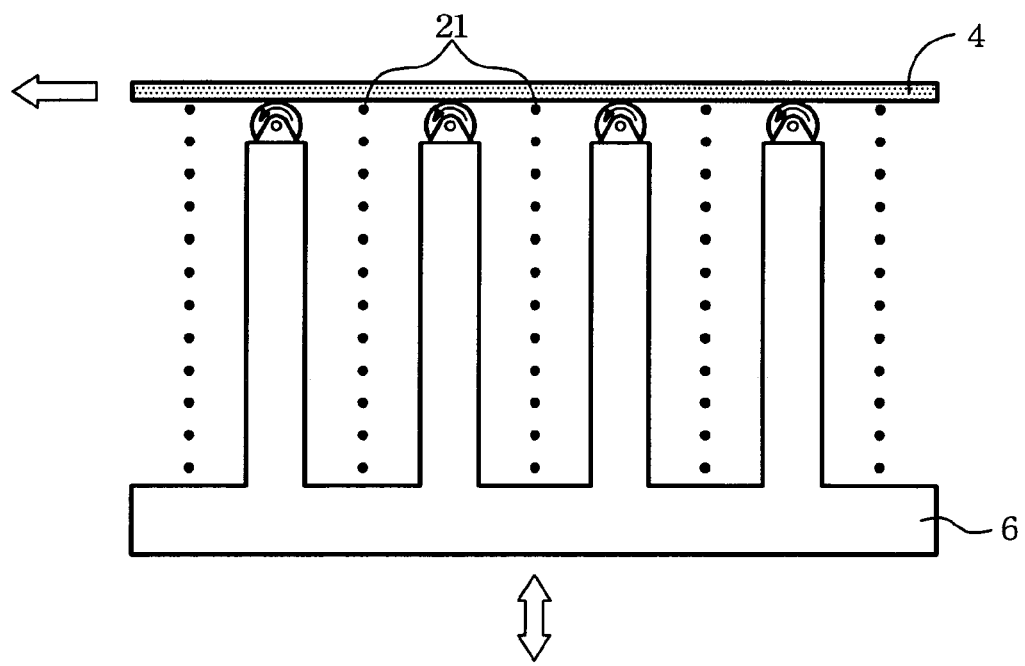
FIG. 2B is a schematic diagram showing a glass substrate unloaded by a delivery device for the cassette of FIG. 2A, in which the up-and-down movable delivery device is equipped to a bottom of the cassette.
Figure 3:
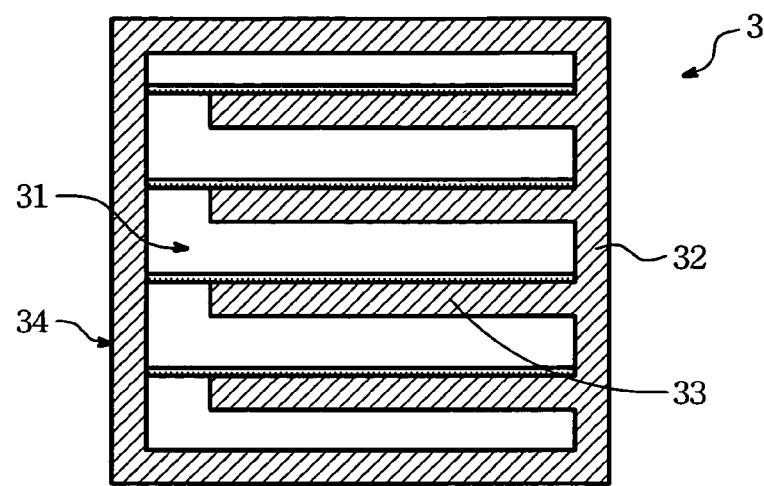
FIG. 3 is a schematic cross-sectional side view of a third conventional cassette.
Figure 4:
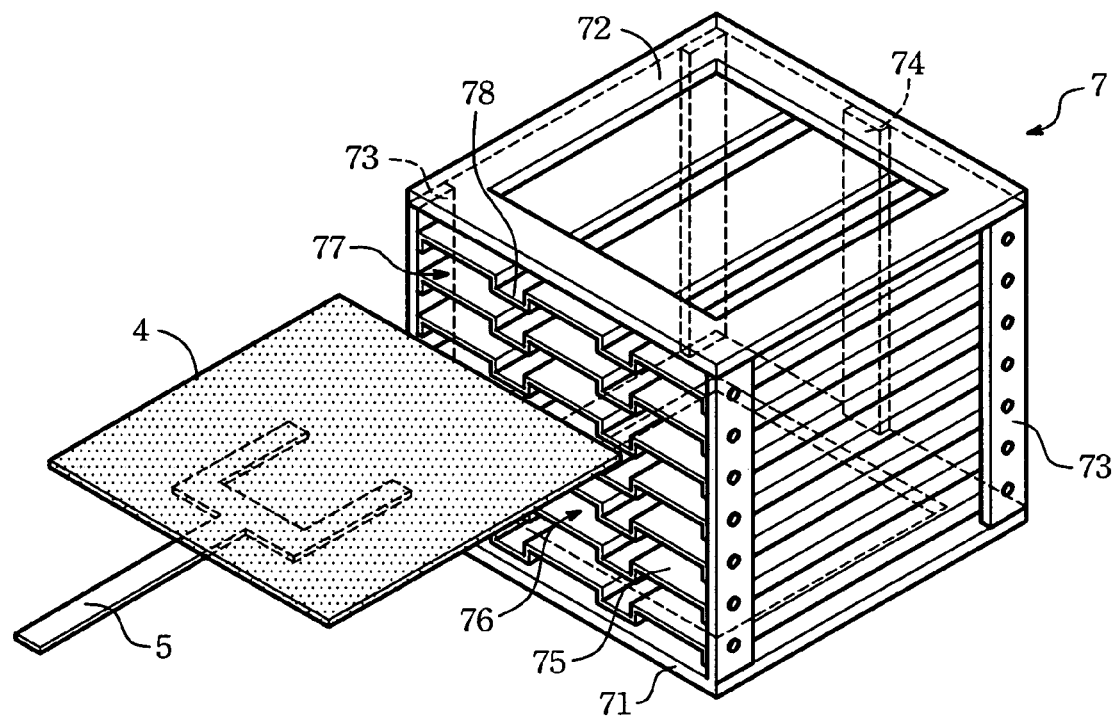
FIG. 4 is a schematic perspective view of a preferred cassette in accordance with the present invention, in which a glass substrate is separately shown.

Referring to FIG. 4, there is shown a preferred cassette 7 of the present invention. The cassette 7 includes a bottom structure 71, a top structure 72, a pair of side supports 73, a rear support 74, and a plurality of support plates 75. The bottom structure 71, the top structure 72, and the pair of side supports 73 are connected to form a cubic frame as shown.

In FIG. 4, the side supports 73 face each other and are affixed at both ends of each side support 73 to the bottom structure 71 and the top structure 72. The rear support 74 located to a rear side of the cassette 7 that connects the sides locating the side plates 73 is also affixed to the bottom structure 71 and the top structure 72. The cubic-shaped cassette 7 is thus substantially formed as a hollow container with a transport gate 76 open in a front side of the cassette 7 opposite to the rear side where the rear support 74 locates.

The support plates 75 inside the cubic cassette 7 are horizontally and parallel affixed between the pair of side supports 73, also located between the bottom structure 71 and the top structure 72. Every two adjacent support plates 75 are separated by a predetermined interval. The support plate 75 is formed as a corrugated structure 77 having recess portions 78 (two recess portions 78 shown in this embodiment). Preferably, the corrugated structure 77 has a shape of a square wave plate commercially available. The orientation of the recess portions 78 of the support plate 75 is preferably arranged to communicate in space with the transport gate 76 so as to allow a delivery device 5, such as a robot arm, to enter for loading or unloading a glass substrate 4 supported on the support plate 75. In one embodiment of the present invention, the number and the dimension of the recess portions 78 may be determined by the configuration of the delivery device 5. For example, in FIG. 4, at least two recess portions 78 are required for the support plate 75 to meet the two-arm fork-shaped delivery device 5.

Figure 5:
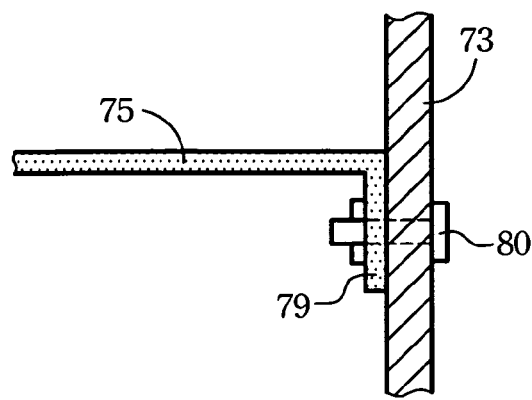
FIG. 5 is a schematic diagram showing a preferred screw connection between a support plate and an inner surface of a side surface of the cassette in accordance with the present invention.

In one embodiment of the present invention, the support plate 75 may be a thin plate structure made of aluminum, steel, titanium, reinforced fiberglass, or reinforce carbon fiber. As shown in FIG. 5, a flange 79 may be formed at the edge of the support plate 75 for providing a screw connection with the side support 73 by screw bolts 80 or the like fastening means, for example.

Figure 6:
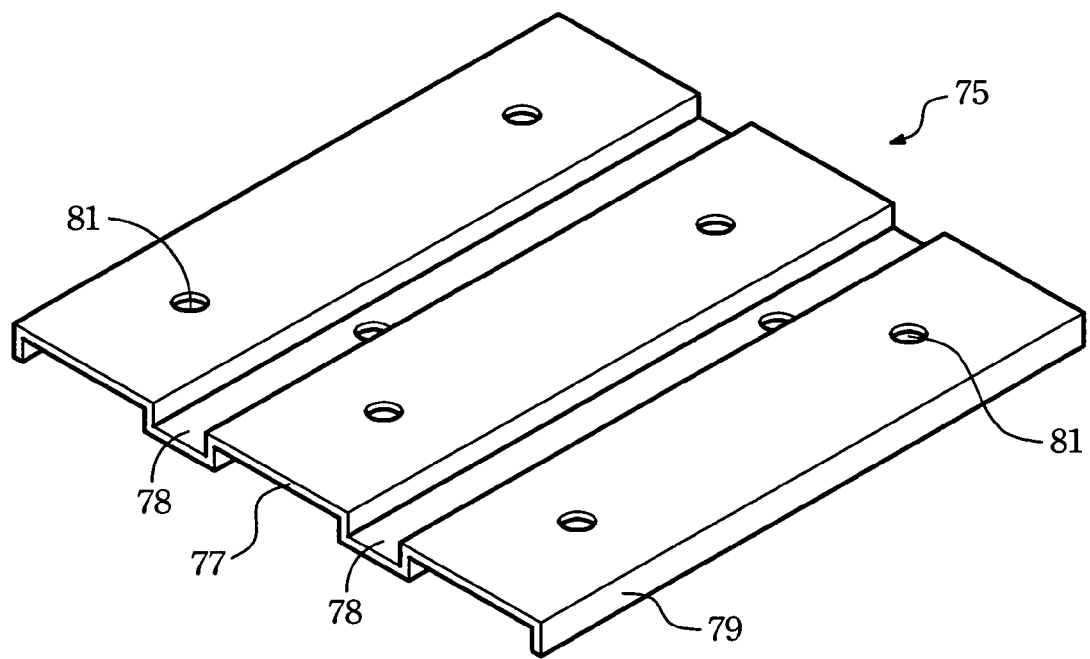
FIG. 6 is a schematic perspective diagram of a preferred support plate of the present invention.

Referring to FIG. 6, there is shown a preferred support plate 75 of the present invention. The support plate 75 has a plurality of through holes 81 to facilitate draining during a rinse operation. Also, the dynamic performance of the cassette 7 may be adjusted by the locations and number of the through holes 81 on the support plates 75. It is well known in the vibration theory that the natural resonance frequency of the support plate 75 as well as that of the cassette 7 may be shifted by the arrangement of the through holes 81. Upon an appropriate arrangement of the through holes 81 on the support plates 75, the glass substrate 4 sustained on the support plate 75 may be away from possible resonance damage resulted from operations of the neighboring equipments.

In one embodiment of the present invention, the support plate 75 may be designed as a thin plate structure so as to reduce the weight but to increase the supporting capacity of the cassette 7. In the application of thin shells or plates, the thin corrugated plate structure has the merit of light weight, high supporting strength, and large span.

Figure 7:
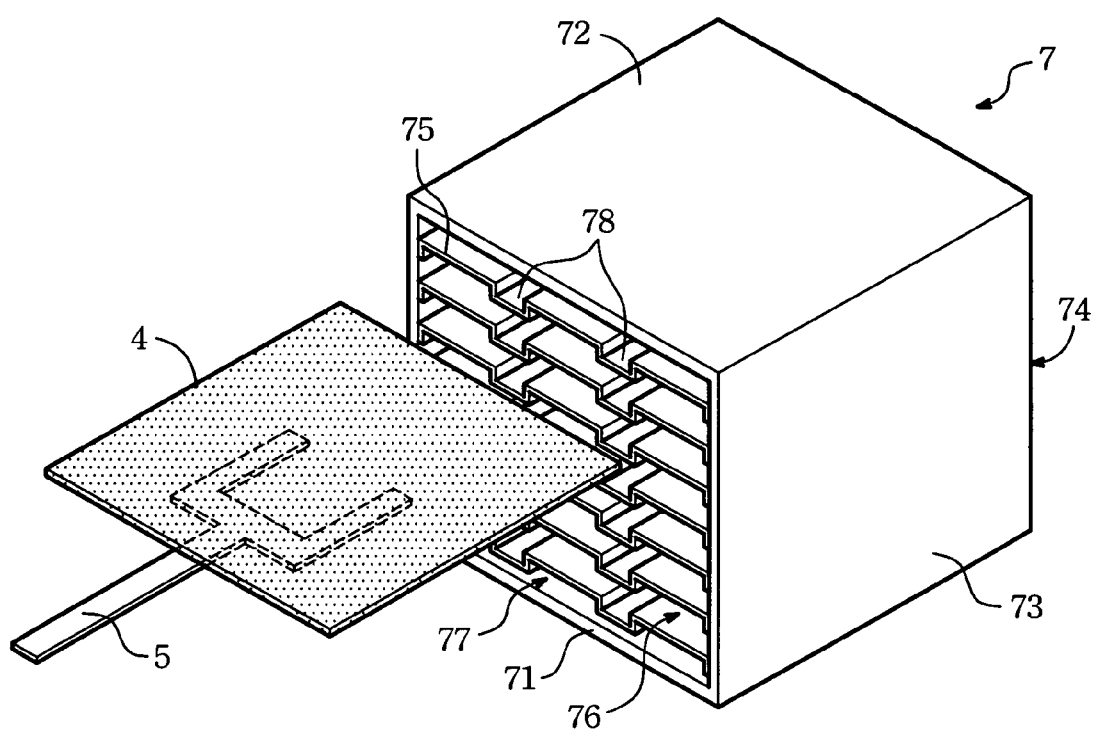
FIG. 7 is a schematic perspective view of another cassette in accordance with the present invention, also in which the glass substrate is separately shown.

Referring to FIG. 7, there is shown another preferred embodiment of the cassette 7 according to the present invention. The elements are substantially the same as those of the previous preferred embodiments described above. However, in this embodiment, the bottom structure 71, the top structure 72, the side supports 73, and the rear support 74 are all formed as plate structures, but not the frame structures in the foregoing embodiment of FIG. 4. In other words, as shown in FIG. 7, the bottom structure 71, the top structure 72, the side supports 73, and the rear support 74 are integrated to form as a container.

In one embodiment of the present invention, the recess portions 78 of the support plate 75, either in FIG. 4 or in FIG. 7, are formed in a parallel pattern.

As compared to the conventional cassettes, the cassette according to the present invention has at least the following advantages:

a. The supporting capacity of the cassette of the invention may be bigger than that of the conventional cassette. Especially when the cassette is used to store large scale glass substrates, the degree of deflection of the glass substrate upon the corrugated support plate is substantially reduced. Also, the surface stress of the glass substrate can be reduced to a degree that the possible damage of the components of the glass substrate from the surface stress no longer occurs.
b. The bending strength of the support plate increases so that the interval between the adjacent support plates can be narrowed and thus the volume of the cassette can be reduced.
c. The arrangement of the through holes on the support plate can be utilized to adjust the weight and dynamic performance of the cassette.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A substrate cassette, comprising: a hollow container having a transport gate open in a front side thereof; a delivery device; and a plurality of support plates, horizontally and parallel affixed inside the container, every two said adjacent support plates being separated by a predetermined interval, the support plate being formed as a corrugated plate structure having at least two recess portions on top thereof, each of the recess portions communicating in space with the transport gate so as to allow the delivery device to enter thereto for either loading a glass substrate on top of the respective support plate or unloading the glass substrate supported on the respective support plate; and wherein one of the corrugated plates has corrugation peaks and corrugation troughs with corrugation sides extending between and interconnecting the peaks and troughs.

2. The substrate cassette according to claim 1, wherein said support plate further has a flange formed at an edge thereof for providing a screw connection with said hollow container.

3. The substrate cassette according to claim 1, wherein said support plate further has a plurality of through holes for a draining purpose during a rinse operation upon said substrate cassette and for arranging dynamic performance of said cassette.

4. The substrate cassette according to claim 1, wherein said support plate is made of a reinforced fiberglass.

5. The substrate cassette according to claim 1, wherein said support plate is made of a material containing reinforced carbon fibers.

6. The substrate cassette according to claim 1, wherein said support plate is made of a metal.

7. The substrate cassette according to claim 1, wherein said delivery device has a two-arm fork structure to meet said respective recess portions of said support plate.

8. The substrate cassette according to claim 1, wherein said corrugated plate structure of said support plate has a shape of a square wave plate.

9. A substrate cassette comprising: a hollow container having a transport gate open in a front side thereof; and a plurality of support plates, horizontally and parallel affixed inside the container, every two of the support plates being separated by a predetermined interval, one of the support plates being formed as a corrugated structure which is substantially horizontally oriented; and wherein one of the corrugated plates has corrugation peaks and corrugation troughs with corrugation sides extending between and interconnecting the peaks and troughs.

10. A substrate cassette of claim 9, wherein the corrugated structure having recess portions communicated in space with the transport gate.

11. A substrate cassette of claim 9, wherein the support plate further having a plurality of through holes thereon.

12. A substrate cassette of claim 11, wherein the corrugated structure having recess portions communicated in space with the transport gate.

13. A substrate cassette comprising: a hollow container having a transport gate open in a front side thereof; and a plurality of support plates, horizontally and parallel affixed inside the container, every two of the support plates being separated by a predetermined interval, one of the support plates having a first corrugated surface and a second corrugated surface, wherein the first corrugated surface and the second corrugated surface are conformed with each other; and wherein one of the corrugated plates has corrugation peaks and corrugation troughs with corrugation sides extending between and interconnecting the peaks and the troughs.

14. A substrate cassette of claim 13, wherein the support plate further having a plurality of through holes thereon.

* * * * *